(12) United States Patent
Zhang

(10) Patent No.: US 8,258,867 B2
(45) Date of Patent: Sep. 4, 2012

(54) FRONT-END EQUALIZER AND AMPLIFIER CIRCUIT

(75) Inventor: Ziche Zhang, Chengdu (CN)

(73) Assignee: IPGoal Microelectronics (Sichuan) Co., Ltd., High-Tech Incubation Park, Chengdu, Sichuan Province (CN)

( * ) Notice: Subject to any disclaimer, the term of this patent is extended or adjusted under 35 U.S.C. 154(b) by 0 days.

(21) Appl. No.: 13/078,642

(22) Filed: Apr. 1, 2011

(65) Prior Publication Data

US 2011/0241779 A1 Oct. 6, 2011

(30) Foreign Application Priority Data

Apr. 6, 2010 (CN) ........................ 2010 2 0150384 U

(51) Int. Cl.
*H03F 3/45* (2006.01)
(52) U.S. Cl. ........................................ 330/252; 330/261
(58) Field of Classification Search .................. 330/252, 330/254, 261, 278, 304
See application file for complete search history.

(56) References Cited

U.S. PATENT DOCUMENTS

| 6,104,242 A * | 8/2000 | Ezell ............................. 330/252 |
| 6,259,312 B1 * | 7/2001 | Murtojarvi .................... 327/563 |
| 6,404,263 B1 * | 6/2002 | Wang ............................ 327/359 |

\* cited by examiner

*Primary Examiner* — Henry Choe

(57) ABSTRACT

A front-end equalizer and amplifier circuit includes two pairs of fully differential pair transistors, wherein the tail currents of one pair of transistors are connected with ground and connected with each other through the capacitive component to realize the connection between the pair of transistors and the feedback capacitor, the tail currents of the other pair of transistors are connected with ground and connected with each other through the resistive component to realize the connection between the other pair of transistors and the feedback resistor, the output positive and negative ends of each pair of transistors are connected with each other through the inductive component, thus forming the load for connecting the voltage source. The circuit increases the high frequency gain. Its single-stage gain is equivalent to the multi-stage gain. Compared with the traditional multi-stage structure, the present invention decreases the power consumption and area, and improves the reliability.

3 Claims, 4 Drawing Sheets

FRONT-END EQUALIZER AND AMPLIFIER CIRCUIT

BACKGROUND OF THE PRESENT INVENTION

1. Field of Invention

The present invention relates to an amplifier circuit, and more particularly to a front-end equalizer and amplifier circuit.

2. Description of Related Arts

Front-end equalizer and amplifier circuits are widely used in the integrated circuits and systems, and especially in a high-speed channel receiver for compensating for the loss of spectral component on the transmission medium while high-speed signal transmission.

In the traditional technology, the circuit is constructed by cascading multi-stage fully differential amplifiers. Increase of series causes some difficulties in the matching circuit, the noise in the multi-stage cascade system is also progressively accumulated, and simultaneously, the multi-stage cascade system increases the phase distortion, such that the jitter of the transmission signal is increased. As shown in FIG. 1, the main mismatch influence caused by the cascade structure is described as below.

the voltage influence caused by the mismatch: $V_{OSC}(total) = A2 \times A3 \times V_{osc1} + A3 \times V_{osc2} + V_{osc3}$ Therefore, the influence of the first-stage mismatch voltage is amplified and becomes the largest owing to the latter two amplifiers, and is A2×A3 times that of the single-stage system.

The main influence caused by the noise is described as below.

$V_{noise}(total) = A2 \times A3 \times V_{noise1} + A3 \times V_{noise2} + V_{noise3}$ Here, A2 denotes the gain of the first-stage amplifier, A3 denotes the gain of the second-stage amplifier, Vnoise1 denotes the output noise of the first-stage amplifier, Vnoise2 denotes the output noise of the second-stage amplifier, and Vnoise3 denotes the output noise of the third-stage amplifier.

Owing to the latter two amplifiers, the influence of the first-stage mismatch voltage is amplified and becomes the largest, and is A2×A3 times that of the single-stage system. At the receiving end of the high-speed channel, the phase is distorted owing to the effect of the large mismatch and the noise accumulation. Accordingly, the jitter of the transmission signal is increased.

SUMMARY OF THE PRESENT INVENTION

An object of the present invention is to provide a front-end equalizer and amplifier circuit, which has a simple-stage, decreases the power consumption and area, and improves the reliability.

Accordingly, in order to accomplish the above object, the present invention provides a front-end equalizer and amplifier circuit, comprising two pairs of fully differential pair transistors, wherein the tail current ends of one pair of transistors are connected with ground and connected with each other through the capacitive component, in order to realize the connection between the pair of fully differential pair transistors and the feedback capacitor, namely, the source feedback capacitor, wherein the tail currents of the other pair of transistors are connected with ground and connected with each other through the resistive component, in order to realize the connection between the other pair of fully differential pair transistors and the feedback resistor, namely, the source feedback resistor, wherein the output positive and negative ends of each pair of fully differential pair transistors are respectively connected with the inductive components, thus forming the load for connecting the voltage source.

Furthermore, the present invention provides a front-end equalizer and amplifier circuit, comprising two pairs of fully differential pair transistors, wherein the tail current ends of one pair of transistors are connected with the power supply and connected with each other through the capacitive component, in order to realize the connection between the pair of fully differential pair transistors and the feedback capacitor, namely, the source feedback capacitor, wherein the tail currents of the other pair of transistors are connected with the power supply and connected with each other through the resistive component, in order to realize the connection between the other pair of fully differential pair transistors and the feedback resistor, namely, the source feedback resistor, wherein the output positive and negative ends of each pair of fully differential pair transistors are respectively connected with the inductive components, thus forming the load for connecting ground.

Compared with the prior art, the present invention can make use of the single-stage operational amplifier to produce two zeros by improving the traditional fully differential operational amplifier, so that the high-frequency gain is increased, and the single-stage gain is equivalent to the multi-stage gain. Accordingly, compared with the traditional multi-stage structure, the power consumption and area of the present invention are decreased, and the reliability thereof is improved.

These and other objectives, features, and advantages of the present invention will become apparent from the following detailed description, the accompanying drawings, and the appended claims.

DETAILED DESCRIPTION OF THE PREFERRED EMBODIMENT

Figure 1:
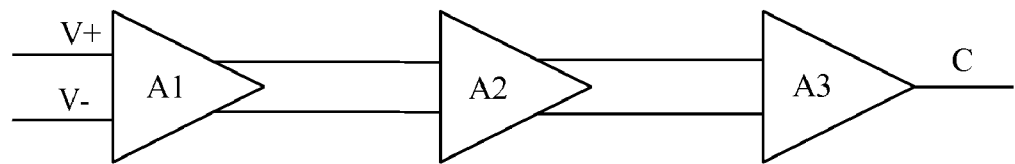
FIG. 1 is a circuit diagram of a traditional front-end amplifier circuit.
Figure 2:
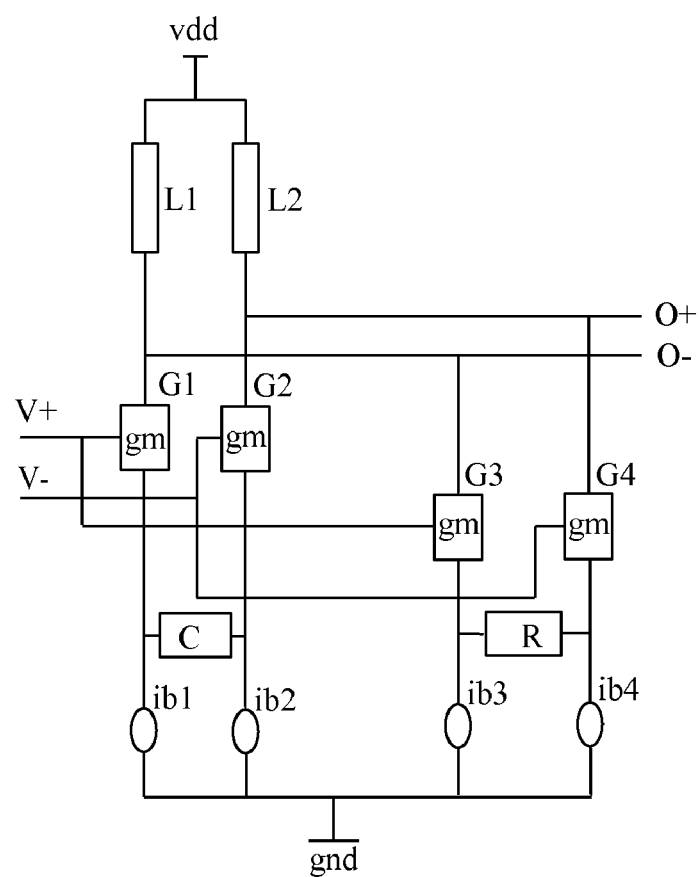
FIG. 2 is a circuit diagram of a front-end equalizer and amplifier circuit according to a first embodiment of the present invention.

Referring to FIG. 2 of the drawings, the connection relation of a front-end equalizer and amplifier circuit according to a first preferred embodiment of the present invention is illustrated as below.

V+ is connected with the input ends of the driving transistors G1 and G3. The source of the G1 and the source of the G3 are respectively connected with the tail currents ib1 and ib3. The amplifying ends of the G1 and G3 are connected with the inductive load L1. V− is connected with the input ends of the driving transistors G2 and G4. The source of the G2 and the source of the G4 are respectively connected with the tail currents ib2 and ib4. The amplifying ends of the G2 and G4 are connected with the inductive load L2. The tail current end of the G1 is connected with the tail current end of the G2 through the capacitive load C. The tail current end of the G3 is connected with the tail current end of the G4 through the resistive load R.

The structural characteristics of the circuit mentioned above are described as follows. The circuit comprises two pairs of fully differential pair transistors, wherein the tail current ends of one pair of transistors G1 and G2 are connected with ground, and the transistor G1 is connected with the transistor G2 through the capacitive component, in order to realize the connection between the pair of fully differential pair transistors and the feedback capacitor, namely, the source feedback capacitor. Furthermore, the tail currents of the other pair of transistors G3 and G4 are connected with ground, and the transistor G3 is connected with the transistor G4 through the resistive component, in order to realize the connection between the other pair of fully differential pair transistors and the feedback resistor, namely, source feedback resistor. The output positive and negative ends of each pair of fully differential pair transistors are respectively connected with the inductive components, thus defining the load for connecting the voltage source.

The working principle of the circuit is described as follows. The circuit is a single-stage circuit, its inductive load provides the first zero, the interaction of the feedback capacitive component and feedback resistive component provides the second zero, namely, the single-stage circuit produces two zeros, so that the turn rise slope from the low frequency to the high frequency of the input-output gain amplitude frequency characteristics curve is increased. Accordingly, the high frequency gain is improved. Simultaneously, the low frequency gain of the input-output gain amplitude frequency characteristics can be adjusted by the feedback resistive component.

The zero provided by the load can be calculated as follows.

The transmission function is $Ad=(S\times gm\times L/(1+gm/SC))+(S\times gm\times L/(1+gmR/2))$ Accordingly, the pole-zero of the amplifier can be adjusted by adjusting parameters R, C and L in the formula mentioned above, so as to adjust the high frequency gain of the operational amplifier. Because the circuit is the single-stage system, Vosc voltage and Vnoise voltage are not accumulated, and the effect on the phase is few. Therefore, the circuit of the present invention can completely replace the traditional multi-stage structure.

Here, Ad denotes the gain of the amplifier, gm denotes the transconductance of the driving transistor, C denotes the equivalent capacitance, L denotes the equivalent inductance, R denotes the equivalent resistance, S denotes the frequency threshold factor, Vosc denotes the mismatch voltage of the amplifier, and Vnoise denotes the equivalent output noise of the amplifier.

Figure 3:
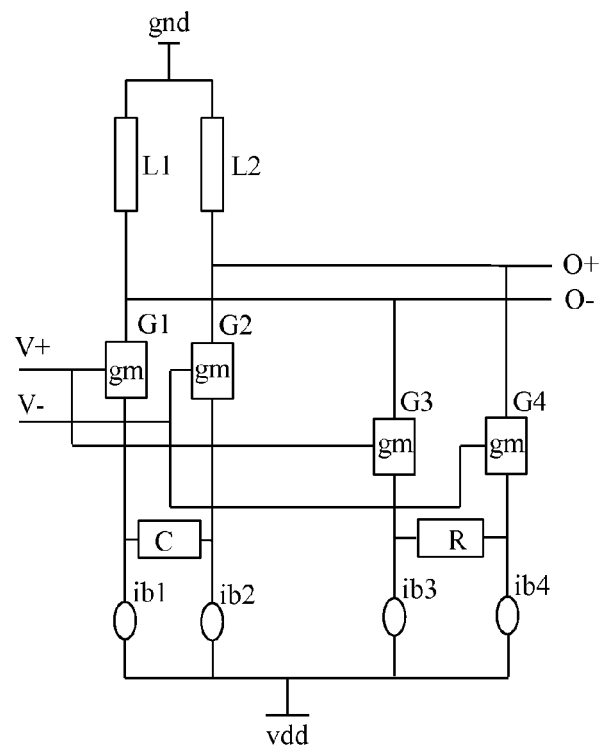
FIG. 3 is a circuit diagram of a front-end equalizer and amplifier circuit according to a second embodiment of the present invention.

Referring to FIG. 3, the connection relation of a front-end equalizer and amplifier circuit according to a second preferred embodiment of the present invention is illustrated as below.

V+ is connected with the input ends of the driving transistors G1 and G3. The source of the G1 and the source of the G3 are respectively connected with the tail currents ib1 and ib3. The amplifying ends of the G1 and G3 are connected with the inductive load L1. V− is connected with the input ends of the driving transistors G2 and G4. The source of the G2 and the source of the G4 are respectively connected with the tail currents ib2 and ib4. The amplifying ends of the G2 and G4 are connected with the inductive load L2. The tail current end of the G1 is connected with the tail current end of the G2 through the capacitive load C. The tail current end of the G3 is connected with the tail current end of the G4 through the resistive load R.

The structural characteristics of the circuit mentioned above are described as follows. The circuit comprises two pairs of fully differential pair transistors, wherein the tail current ends of one pair of transistors G1 and G2 are connected with the voltage source, and the transistor G1 is connected with the transistor G2 through the capacitive component, in order to realize the connection between the pair of fully differential pair transistors and the feedback capacitor, namely, the source feedback capacitor. Furthermore, the tail currents of the other pair of transistors G3 and G4 are connected with the voltage source, and the transistor G3 is connected with the transistor G4 through the resistive component, in order to realize the connection between the other pair of fully differential pair transistors and the feedback resistor, namely, source feedback resistor. The output positive and negative ends of each pair of fully differential pair transistors are respectively connected with the inductive components, thus defining the load for connecting ground.

The working principle of the circuit is described as follows. The circuit is a single-stage circuit, its inductive load provides the first zero, the interaction of the feedback capacitive component and feedback resistive component provides the second zero, namely, the single-stage circuit produces two zeros, so that the turn rise slope from the low frequency to the high frequency of the input-output gain amplitude frequency characteristics curve is increased. Accordingly, the high frequency gain is improved. Simultaneously, the low frequency gain of the input-output gain amplitude frequency characteristics can be adjusted by the feedback resistive component.

The zero provided by the load can be calculated as follows.

The transmission function is $Ad=(S\times gm\times L/(1+gm/SC))+(S\times gm\times L/(1+gmR/2))$ Accordingly, the pole-zero of the amplifier can be adjusted by adjusting parameters R, C and L in the formula mentioned above, so as to adjust the high frequency gain of the operational amplifier. Because the circuit is the single-stage system, Vosc voltage and Vnoise voltage are not accumulated, and the effect on the phase is few. Therefore, the circuit of the present invention can completely replace the traditional multi-stage structure.

Here, Ad denotes the gain of the amplifier, gm denotes the transconductance of the driving transistor, C denotes the equivalent capacitance, L denotes the equivalent inductance, R denotes the equivalent resistance, S denotes the frequency threshold factor, Vosc denotes the mismatch voltage of the amplifier, and Vnoise denotes the equivalent output noise of the amplifier.

Figure 4:
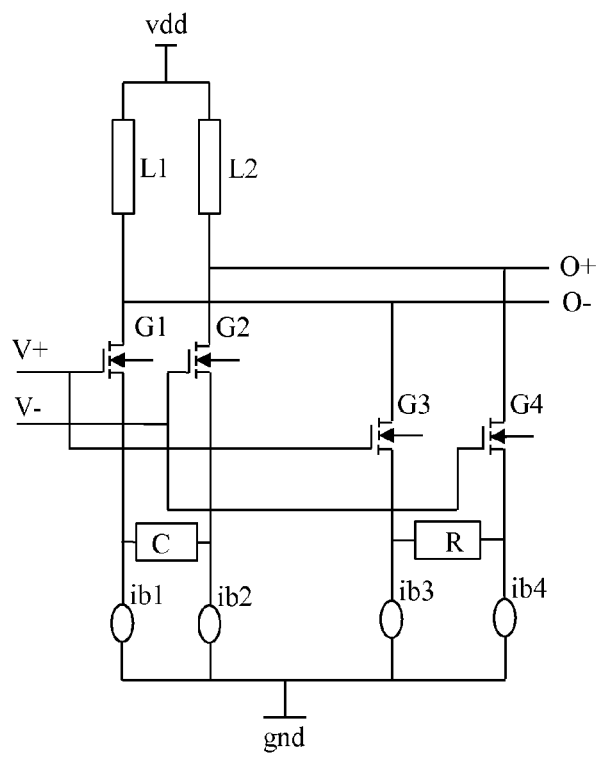
FIG. 4 is a circuit diagram of the front-end equalizer and amplifier circuit using CMOS technology according to the first embodiment of the present invention.

Referring to FIG. 4, the front-end equalizer and amplifier circuit according to the first preferred embodiment of the present invention adopts CMOS (Complementary Metal Oxide Semiconductor) technology, and its structural characteristics are described as below.

The circuit comprises two pairs of NMOS fully differential pair transistors, wherein the tail current ends of one pair of NMOS transistors are connected with ground, and the pair of NMOS transistors are connected with each other through the capacitive component, in order to realize the connection between the pair of fully differential pair transistors and the feedback capacitor, namely, source feedback capacitor. Furthermore, the tail current ends of the other pair of NMOS transistors are connected with ground, and the other pair of NMOS transistors are connected with each other through the resistive component, in order to realize the connection between the other pair of fully differential pair transistors and the feedback resistor, namely, source feedback resistor. The output positive and negative ends of each pair of NMOS transistors are respectively connected with the inductive components, thus defining the load for connecting the voltage source.

Figure 5:
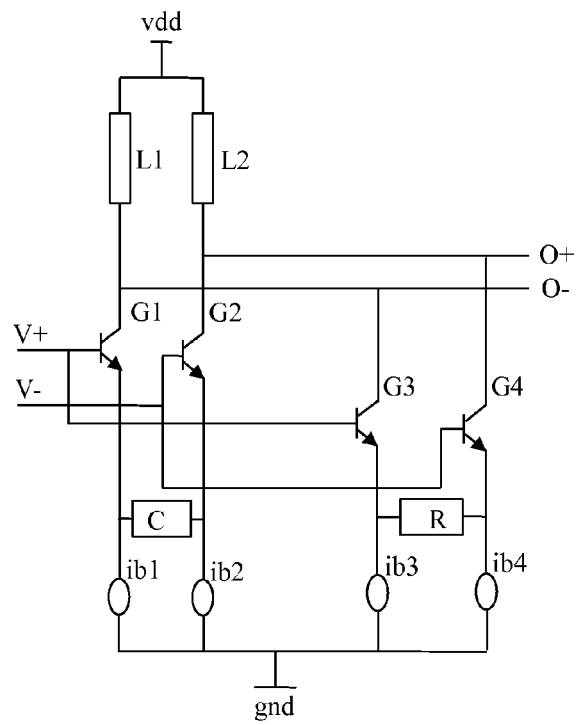
FIG. 5 is a circuit diagram of the front-end equalizer and amplifier circuit using BJT technology according to the first embodiment of the present invention.

Referring to FIG. 5, the front-end equalizer and amplifier circuit according to the first preferred embodiment of the present invention adopts BJT (Bipolar Junction Transistor) technology. Its structural characteristics are described as below.

The circuit comprises two pairs of NPN fully differential pair transistors, wherein the tail current ends of one pair of NPN transistors are connected with ground, and the pair of NPN transistors are connected with each other through the capacitive component, in order to realize the connection between the pair of fully differential pair transistors and the feedback capacitor, namely, source feedback capacitor. Furthermore, the tail current ends of the other pair of NPN transistors are connected with ground, and the other pair of NPN transistors are connected with each other through the resistive component, in order to realize the connection between the other pair of fully differential pair transistors and the feedback resistor, namely, source feedback resistor. The output positive and negative ends of each pair of NPN transistors are respectively connected with the inductive components, thus defining the load for connecting the voltage source.

Figure 6:
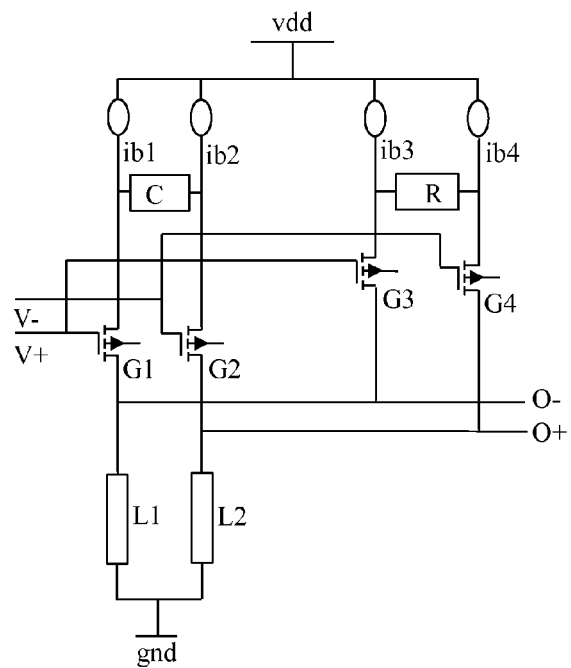
FIG. 6 is a circuit diagram of the front-end equalizer and amplifier circuit using CMOS technology according to the second embodiment of the present invention.

Referring to FIG. 6, the front-end equalizer and amplifier circuit according to the second preferred embodiment of the present invention adopts CMOS (Complementary Metal Oxide Semiconductor) technology, and its structural characteristics are described as below.

The circuit comprises two pairs of PMOS fully differential pair transistors, wherein the tail current ends of one pair of PMOS transistors are connected with the power supply, and the pair of PMOS transistors are connected with each other through the capacitive component, in order to realize the connection between the pair of fully differential pair transistors and the feedback capacitor, namely, source feedback capacitor. Furthermore, the tail current ends of the other pair of PMOS transistors are connected with the power supply, and the other pair of PMOS transistors are connected with each other through the resistive component, in order to realize the connection between the other pair of fully differential pair transistors and the feedback resistor, namely, source feedback resistor. The output positive and negative ends of each pair of PMOS transistors are respectively connected with the inductive components, thus defining the load for connecting ground.

Figure 7:
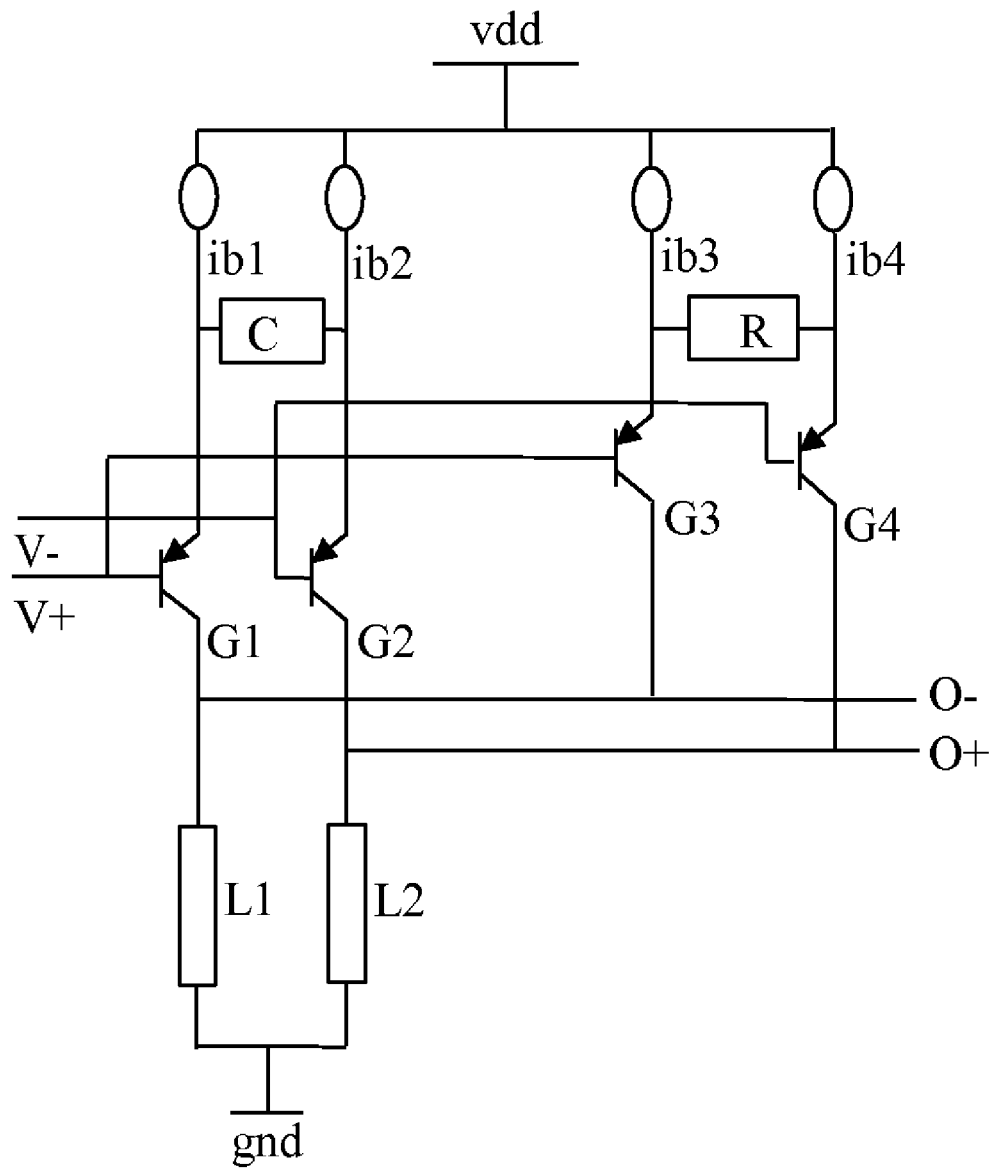
FIG. 7 is a circuit diagram of the front-end equalizer and amplifier circuit using BJT technology according to the second embodiment of the present invention.

Referring to FIG. 7, the front-end equalizer and amplifier circuit according to the second preferred embodiment of the present invention adopts BJT (Bipolar Junction Transistor) technology. Its structural characteristics are described as below.

The circuit comprises two pairs of PNP fully differential pair transistors, wherein the tail current ends of one pair of PNP transistors are connected with the power supply, and the pair of PNP transistors are connected with each other through the capacitive component, in order to realize the connection between the pair of fully differential pair transistors and the feedback capacitor, namely, source feedback capacitor. Furthermore, the tail current ends of the other pair of PNP transistors are connected with the power supply, and the other pair of PNP transistors are connected with each other through the resistive component, in order to realize the connection between the other pair of fully differential pair transistors and the feedback resistor, namely, source feedback resistor. The output positive and negative ends of each pair of PNP transistors are respectively connected with the inductive components, thus defining the load for connecting the voltage source.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A front-end equalizer and amplifier circuit, comprising a first pair of fully differential pair transistors and a second pair of fully differential pair transistors, wherein a first end of a first transistor of said first pair is connected with ground through a first tail current, a second end of said first transistor of said first pair is connected with a power supply through a first inductive load and a negative output, and a third end of said first transistor of said first pair is connected with a positive input;

wherein a first end of a second transistor of said first pair is connected with ground through a second tail current, a second end of said second transistor of said first pair is connected with a power supply through a second inductive load and a positive output, and a third end of said second transistor of said first pair is connected with a negative input;

wherein said first end of said first transistor of said first pair is connected with said first end of said second transistor of said first pair through a capacitive component;

wherein a first end of a first transistor of said second pair is connected with ground through a third tail current, a second end of said first transistor of said second pair is connected with said negative output, and a third end of said first transistor of said second pair is connected with said positive input;

wherein a first end of a second transistor of said second pair is connected with ground through a fourth tail current, a second end of said second transistor of said second pair is connected with said positive output, and a third end of said second transistor of said second pair is connected with said negative input;

wherein said first end of said first transistor of said second pair is connected with said first end of said second transistor of said second pair through a resistive component.

2. The front-end equalizer and amplifier circuit, as recited in claim 1, wherein said first pair of fully differential pair transistors and said second pair of fully differential pair transistors are two pairs of NMOS fully differential pair transistors.

3. The front-end equalizer and amplifier circuit, as recited in claim 1, wherein said first pair of fully differential pair transistors and said second pair of fully differential pair transistors are two pairs of NPN fully differential pair transistors.

* * * * *